(12) United States Patent
Gaidis et al.

(10) Patent No.: US 10,460,779 B2
(45) Date of Patent: Oct. 29, 2019

(54) MRAM REFERENCE CELL WITH SHAPE ANISOTROPY TO ESTABLISH A WELL-DEFINED MAGNETIZATION ORIENTATION BETWEEN A REFERENCE LAYER AND A STORAGE LAYER

(71) Applicant: Crocus Technology Inc., Santa Clara, CA (US)

(72) Inventors: Michael Gaidis, San Jose, CA (US); Thao Tran, Milpitas, CA (US)

(73) Assignee: CROCUS TECHNOLOGY INC., Santa Clara, CA (US)

( * ) Notice: Subject to any disclaimer, the term of this patent is extended or adjusted under 35 U.S.C. 154(b) by 0 days.

(21) Appl. No.: 15/891,233

(22) Filed: Feb. 7, 2018

(65) Prior Publication Data
US 2018/0226112 A1  Aug. 9, 2018

Related U.S. Application Data

(60) Provisional application No. 62/456,545, filed on Feb. 8, 2017.

(51) Int. Cl.
| | |
|---|---|
| *G11C 11/16* | (2006.01) |
| *H01L 43/08* | (2006.01) |
| *H01F 10/32* | (2006.01) |
| *H01L 43/12* | (2006.01) |
| *H01L 27/22* | (2006.01) |
| *H01L 43/02* | (2006.01) |

(52) U.S. Cl.
CPC ........ *G11C 11/161* (2013.01); *G11C 11/1673* (2013.01); *H01F 10/3254* (2013.01); *H01F 10/3286* (2013.01); *H01L 27/228* (2013.01); *H01L 43/02* (2013.01); *H01L 43/08* (2013.01); *H01L 43/12* (2013.01)

(58) Field of Classification Search
CPC .............. G11C 11/161; G11C 11/1673; H01F 10/3254; H01F 10/3286
See application file for complete search history.

(56) References Cited

U.S. PATENT DOCUMENTS

| | | | |
|---|---|---|---|
| 2007/0195585 A1* | 8/2007 | Sakimura | G11C 11/16 365/158 |
| 2011/0110151 A1* | 5/2011 | Prejbeanu | B82Y 25/00 365/173 |
| 2016/0211036 A1* | 7/2016 | Takizawa | G11C 11/161 |
| 2017/0062033 A1* | 3/2017 | Fujita | G11C 11/1673 |

* cited by examiner

*Primary Examiner* — David Lam
(74) *Attorney, Agent, or Firm* — Cooley LLP

(57) ABSTRACT

An apparatus has a reference magnetic tunnel junction with a high aspect ratio including a reference layer with magnetization along a minor axis and a storage layer with magnetization along a major axis. The storage layer magnetization is substantially perpendicular to the magnetization along the minor axis. The magnetization orientation between the minor axis and the major axis is maintained by shape anisotropy caused by the high aspect ratio.

7 Claims, 4 Drawing Sheets

Resistance and Conductance vs. Storage Layer Angle

MRAM REFERENCE CELL WITH SHAPE ANISOTROPY TO ESTABLISH A WELL-DEFINED MAGNETIZATION ORIENTATION BETWEEN A REFERENCE LAYER AND A STORAGE LAYER

CROSS-REFERENCE TO RELATED APPLICATION

This application claims priority to U.S. Provisional Patent Application Ser. No. 62/456,545, filed Feb. 8, 2017.

FIELD OF THE INVENTION

This invention relates generally to magnetoresistive random access memory (MRAM). More particularly, this invention is directed to an MRAM reference cell with shape anisotropy to establish a well-defined magnetization orientation between a reference layer and a storage layer.

BACKGROUND OF THE INVENTION

MRAM bit cell state determination typically relies on the use of amplifiers and comparators to determine if the MRAM bit's resistance is higher or lower than a stable reference resistor. The MRAM bit is considered a "1" or a "0" depending on whether its resistance is higher or lower than the reference. The reference resistance should be of a value that allows one to separate the two states of an MRAM device (parallel versus antiparallel magnetization, or, equivalently, low resistance versus high resistance).

An ideal circuit would involve temperature compensation such that over the operating temperature range the reference resistance varies at the same rate as the memory cell resistance as a function of temperature. An elegant way to achieve this thermal coefficient of resistance matching is to use a similar MRAM device as the reference element.

In the case of thermal-assist MRAM, high-temperature operations such as solder re-flow for device attach can decouple an antiferromagnetic layer from the ferromagnetic storage layer, allowing the storage layer magnetization to change direction, and thus causing the device to assume an indeterminate resistance. Because of this effect, resistors made from MRAM elements in thermal-assist MRAM do not provide useful, stable reference resistances against which one can compare the memory cell resistance.

It would be desirable to provide an MRAM reference cell that does not rely upon a non-MRAM ROM to set an MRAM reference resistance value, or upon large-area non-MRAM resistors with costly trimming steps and poorly matched temperature coefficients of resistance. In addition, it would be desirable to provide an MRAM reference cell that does not need to be programmed after solder re-flow associated with part attachment. Such a reference cell would provide a more compact memory, well-match temperature coefficient of resistance between memory elements and reference elements, and a reference memory with resistance value set by the circuit layout design rather than through a boot-up procedure.

SUMMARY OF THE INVENTION

An apparatus has a reference magnetic tunnel junction with a high aspect ratio including a reference layer with magnetization along a minor axis and a storage layer with magnetization along a major axis. The storage layer magnetization is substantially perpendicular to the magnetization along the minor axis. The magnetization orientation between the minor axis and the major axis is maintained by shape anisotropy caused by the high aspect ratio.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
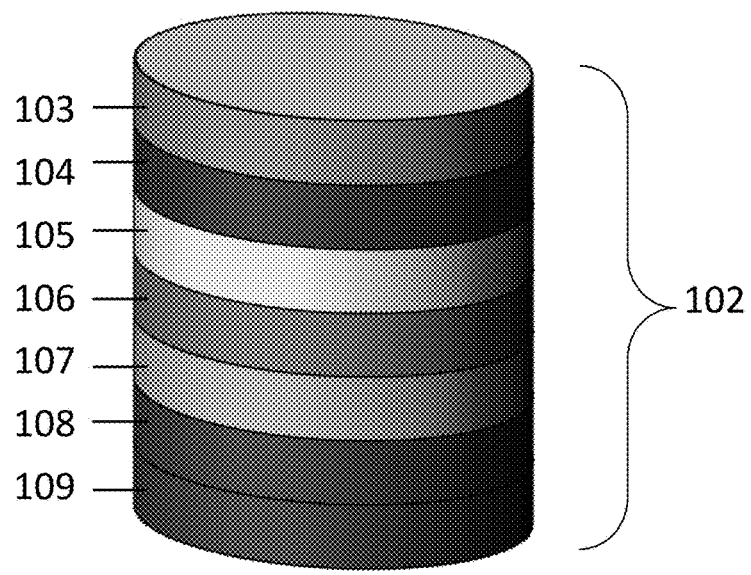
FIG. 1 illustrates a side view of an MRAM cell comprised of a stack of thin films that may be used in accordance with an embodiment of the invention.

FIG. 1 illustrates a Magnetic Tunnel Junction (MTJ) stack 102 that may be utilized in accordance with an embodiment of the invention. MTJ stack 102 includes a low-blocking-temperature antiferromagnetic pinning layer 103, a ferrogmagnetic storage layer 104, a tunnel barrier 105, a reference layer 106 with Ruderman-Kittel-Kasuya-Yosida (RKKY) coupling through layer 107 to a pinned layer 108, which is strongly pinned by a high-blocking-temperature antiferromagnet 109. The invention is useful when the MRAM pinned layer 108 is strongly pinned even at high temperature and the storage layer 104 is not pinned at high temperature.

Standard materials may be used in the MTJ stack 102. The invention is directed toward the shape of the MTJ stack 102. In particular, the invention relies upon shape anisotropy to obtain desired performance. Anisotropy refers to directionally dependent properties in different directions. Shape anisotropy is used in this invention by modifying the aspect ratio in the plane of the MTJ stack layers 102 to obtain desired performance. Aspect ratio refers to size in different directions, such as the ratio of a major axis to a minor axis. For a circular MTJ, a top-down view of stack 102 would reveal that the major axis and minor axis are equivalent. The invention instead utilizes a high aspect ratio reference MTJ, such as MTJ 202 of FIG. 2. As used herein, a high aspect ratio references an aspect ratio of at least 5:3 (i.e., a major axis of at least 5 and a minor axis of 3 or less). The resultant shape may be elliptical, diamond, or other configuration. The exact shape itself is less significant than the utilization of a high aspect ratio.

Figure 2:
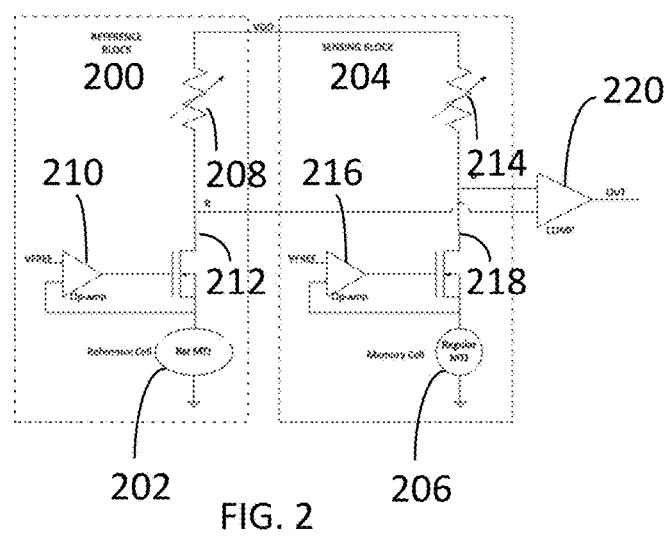
FIG. 2 illustrates a reference cell and associated sensing block configured in accordance with an embodiment of the invention.

FIG. 2 illustrates a high aspect ratio MTJ 202 as an element in a reference block 200. A standard (possibly circular) memory element MTJ 206 is an element in sensing block 204. The reference block 200 also includes standard components, such as a variable resistor 208, operational amplifier 210 and N-Channel MOSFET 212. The N-Channel MOSFET 212 is a voltage-controlled current sink. Operating in conjunction with the operational amplifier 210, it biases a constant current through the MTJ, thus generating a stable voltage on the input nodes to the comparator 220. Similarly, the sensing block 204 includes standard components, such as a variable resistor 214, operational amplifier 216 and N-Channel MOSFET 218. A comparator 220 processes a reference signal from the reference block 200 and a sense signal from the sensing block 204.

Figure 3:
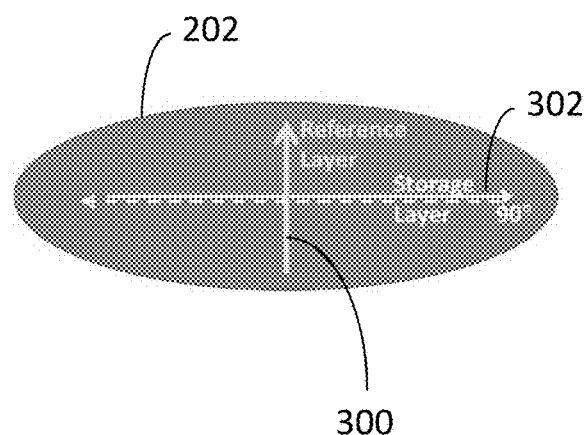
FIG. 3 illustrates a top-down view of a high aspect ratio MRAM cell utilized in accordance with an embodiment of the invention.

FIG. 3 illustrates a top-down view of high aspect ratio MTJ 202. In this example, the high aspect ratio is manifested as an ellipse. That is, the MTJ stack 202 (e.g., corresponding to 102 in FIG. 1), has the shape of an ellipse. The reference layer (e.g., 106 in FIG. 1) is annealed during manufacture to have orientation of magnetization along the minor axis 300. During standard wafer processing or solder re-flow conditions with temperature high enough to decouple the storage layer from the adjacent antiferromagnet, the storage layer (e.g., 104) relaxes to a low energy state along major axis 302 substantially perpendicular to the reference layer by shape anisotropy. As detailed in FIGS. 5 and 6, the conductance of high aspect ratio MTJ 202 is approximately half way between minimum conductance and maximum conductance of a substantially round MTJ (e.g., 206) of the same area. Solder re-flow temperatures are not high enough to disturb the direction of the reference layer, as it is coupled indirectly to an antiferromagnet with high blocking temperature. The high aspect ratio thus preserves the relative perpendicularity between storage and reference magnetic states even during solder re-flow. Consequently, after solder re-flow the reference MTJ 202 does not need to be programmed. Essentially, the MTJ is programmed through the anneal operation at the time of manufacture. Thereafter, the reference block 200 can operate without further programming.

Figure 4:
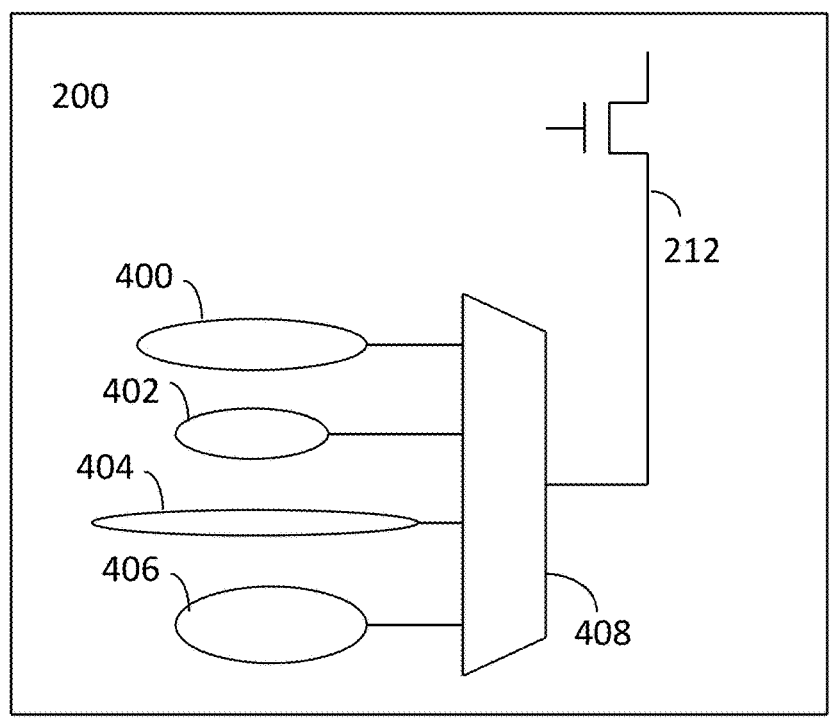
FIG. 4 illustrates a reference cell configured in accordance with an embodiment of the invention.

FIG. 4 illustrates a segment of reference block 200, including transistor 212. The remaining elements shown in FIG. 2 are omitted for simplicity. For a refined manufacturing process, the appropriate high aspect ratio and device size may be known. On the other hand, for an immature manufacturing processing, it may be desirable to provide a reference block 200 with a variety of MTJs 400, 402, 404 and 406 with different high aspect ratios or areas. A multiplexer 408 may then be used to select the MTJ with the most effective high aspect ratio and area to serve as a midpoint reference for memory array MTJ resistance states. Series or parallel connections of the high aspect ratio device can be used as inputs to the multiplexer 408 if combinations are more convenient than shaping a single MTJ.

Figure 5:
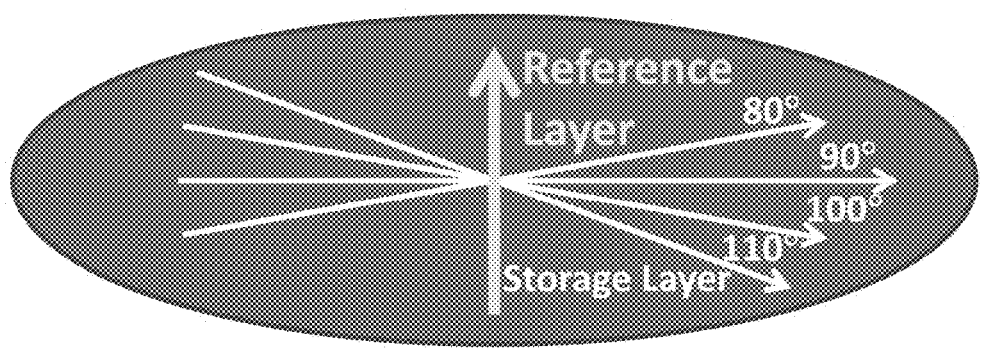
FIG. 5 illustrates resistance and conductance relationships utilized in accordance with embodiments of the invention.
Figure 6:
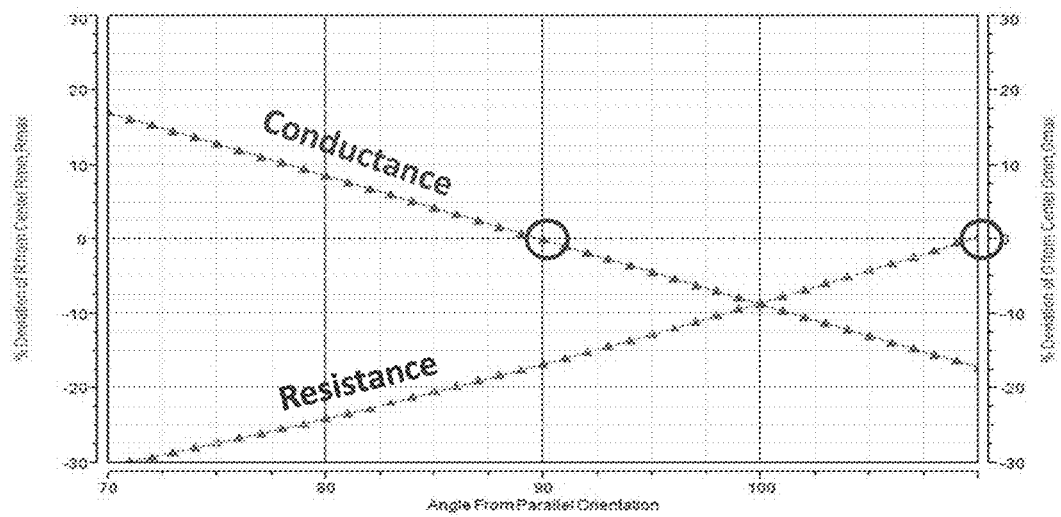
FIG. 6 illustrates resistance and conductance values associated with embodiments of the invention.

FIG. 5 illustrates angular orientations of magnetization direction between the storage layer and reference layer to assist with the interpretation of the plot in FIG. 6. The following equations govern the conductance of the MTJ for MTJ reference cells that are not perfectly perpendicular to the reference layer.

The effect of varying angle on MTJ conduction is best expressed in terms of conductance, G (=1/R):

$$G_\theta = G_P + G_{AP}/2 + G_P - G_{AP}/2 \cdot \cos \theta$$

where $\theta$ is the angle between storage layer and reference layer orientations, $G_P$ is the conductance in the parallel state ($\theta=0$), and
$G_{AP}$ is the conductance in the antiparallel state ($\theta=180°$)
Note that:

$G=G_{midpoint}$ between the $G_P$ and the $G_{AP}$ states when $\theta=90°$, but $R=R_{midpoint}$ between the $R_P$ and the $R_{AP}$ states when $\theta \approx 110°$ FIG. 6 illustrates plotted conductance and resistance deviation as a function of the angle from parallel orientation. The X-axis refers to the angle from parallel orientation of the storage layer and the reference layer. In the ideal case, shape anisotropy would make this angle 90 degrees (i.e., perpendicular storage and reference layers), and corresponds to the diagram in FIG. 5. The Y-axis in FIG. 6 gives the percent deviation from the halfway point of conductance or resistance. From the equation in FIG. 5, we see the conductance at 90 degree (perpendicular) orientation is equal to the midpoint of the parallel and antiparallel configurations of the memory cell (i.e., zero percent deviation from the midpoint as per the Y-axis), and thus provides a very good reference against which to compare to a memory cell of the same area but of arbitrary shape. When dealing with conductance, it is straightforward to find the midpoint between maximum and minimum conductances as one rotates the orientation of the storage layer. If one chooses to work with resistances, one must take into account that the perpendicular configuration does not provide the midpoint of resistance between minimum and maximum resistances. The perpendicular configuration of storage and reference magnetizations results in a resistance that is roughly 17% less than the resistance of the midpoint between the high and low resistance states. One may therefore compensate by making the reference MTJ roughly 17% smaller in area than the corresponding memory MTJs against which it is compared.

Figure 7:
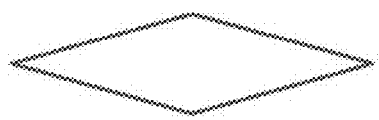
FIG. 7 illustrates an alternate high aspect ratio shape that may be used in accordance with an embodiment of the invention.
Figure 8:
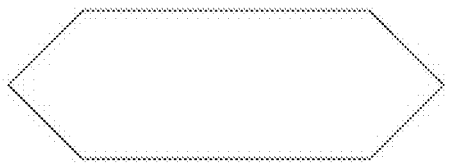
FIG. 8 illustrates another high aspect ratio shape that may be used in accordance with an embodiment of the invention.

FIGS. 7 and 8 illustrate alternate high aspect ratio shapes that may be used in accordance with embodiments of the invention.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:
1. An apparatus, comprising:
a reference magnetic tunnel junction to produce a reference signal, the reference magnetic tunnel junction with a high aspect ratio including a reference layer in an annealed state to establish permanent magnetization along a minor axis and a storage layer with magnetization along a major axis, wherein the storage layer magnetization is substantially perpendicular to the magnetization along the minor axis, the magnetization orientation between the minor axis and the major axis being maintained by shape anisotropy caused by the high aspect ratio.

2. The apparatus of claim 1 wherein the reference magnetic tunnel junction has an area corresponding to a substantially round magnetic tunnel junction memory element that produces a sense signal.

3. The apparatus of claim 2 wherein the reference signal is approximately one half way between a maximum resistance sense signal and a minimum resistance sense signal.

4. The apparatus of claim 2 wherein the substantially round magnetic tunnel junction state that produces the sense signal is positioned within a sense block with a variable resistor, operational amplifier and a pull-down transistor.

5. The apparatus of claim 2 further comprising a comparator to process the sense signal and the reference signal.

6. The apparatus of claim 1 wherein the reference magnetic tunnel junction is positioned within a reference block with a variable resistor, operational amplifier and a pull-down transistor.

7. The apparatus of claim 1 wherein the reference magnetic tunnel junction is positioned within a reference block with a multiplexer to select one of a plurality of reference magnetic tunnel junctions with different aspect ratios or areas.

* * * * *